US008841678B2

(12) United States Patent
Kanegae et al.

(10) Patent No.: US 8,841,678 B2
(45) Date of Patent: Sep. 23, 2014

(54) THIN-FILM TRANSISTOR DEVICE AND METHOD FOR MANUFACTURING THIN-FILM TRANSISTOR DEVICE

(71) Applicants: Panasonic Corporation, Osaka (JP); Panasonic Liquid Crystal Display Co., Ltd., Hyogo (JP)

(72) Inventors: Arinobu Kanegae, Osaka (JP); Takahiro Kawashima, Osaka (JP); Hiroshi Hayashi, Kyoto (JP); Genshirou Kawachi, Chiba (JP)

(73) Assignees: Panasonic Corporation, Osaka (JP); Panasonic Liquid Crystal Display Co., Ltd., Hyogo (JP)

( * ) Notice: Subject to any disclaimer, the term of this patent is extended or adjusted under 35 U.S.C. 154(b) by 32 days.

(21) Appl. No.: 13/737,275

(22) Filed: Jan. 9, 2013

(65) Prior Publication Data

US 2013/0119391 A1 May 16, 2013

Related U.S. Application Data

(63) Continuation of application No. PCT/JP2011/003749, filed on Jun. 30, 2011.

(51) Int. Cl.
- *H01L 21/02* (2006.01)
- *H01L 29/786* (2006.01)
- *H01L 29/04* (2006.01)
- *H01L 29/66* (2006.01)

(52) U.S. Cl.
CPC ........ *H01L 29/786* (2013.01); *H01L 29/78612* (2013.01); *H01L 29/04* (2013.01); *H01L 29/78669* (2013.01); *H01L 29/78696* (2013.01); *H01L 29/66742* (2013.01); *H01L 29/78678* (2013.01); *H01L 29/78687* (2013.01)
USPC ..... 257/72; 257/43; 257/E21.006; 257/E29.151; 257/E29.306

(58) Field of Classification Search
CPC ............ H01L 29/786; H01L 29/78606; H01L 29/78693; H01L 27/1214; H01L 27/3262
USPC .......... 257/43, 57, 72, E21.006, 29.129, 296, 257/151, 304–306
See application file for complete search history.

(56) References Cited

U.S. PATENT DOCUMENTS

| 6,512,252 B1 | 1/2003 | Takagi et al. |
| 6,753,555 B2 | 6/2004 | Takagi et al. |

(Continued)

FOREIGN PATENT DOCUMENTS

| JP | 60-098680 | 6/1985 |
| JP | 10-326748 | 12/1998 |

(Continued)

OTHER PUBLICATIONS

International Search Report in International Application No. PCT/JP2011/003749, dated Oct. 4, 2011.

(Continued)

*Primary Examiner* — Michael Lebentritt
(74) *Attorney, Agent, or Firm* — Greenblum & Bernstein, P.L.C.

(57) ABSTRACT

A thin-film transistor device includes: a gate electrode above a substrate; a gate insulating film on the gate electrode; a crystalline silicon thin film including a channel region which is provided on the gate insulating film; semiconductor films on at least the channel region; an insulating film made of an organic material which is provided over the channel region and above the semiconductor films; a source electrode over at least an end portion of the insulating film; and a drain electrode over at least the other end portion of the insulating film and facing the source electrode. The semiconductor films include at least a first semiconductor film and a second semiconductor film provided on the first semiconductor film. A relationship $E_{CP} < E_{C1}$ is satisfied where $E_{CP}$ and $E_{C1}$ denote energy levels at lower ends of conduction bands of the crystalline silicon thin film and the first semiconductor film, respectively.

10 Claims, 11 Drawing Sheets

(56) References Cited

U.S. PATENT DOCUMENTS

| | | | |
|---|---|---|---|
| 7,005,344 B2 * | 2/2006 | Forbes et al. | 438/257 |
| 7,205,586 B2 | 4/2007 | Takagi et al. | |
| 8,253,135 B2 * | 8/2012 | Uochi et al. | 257/43 |
| 8,278,665 B2 | 10/2012 | Asanuma et al. | |
| 8,373,203 B2 * | 2/2013 | Yamazaki et al. | 257/227 |
| 8,377,744 B2 * | 2/2013 | Yamazaki et al. | 438/104 |
| 2003/0052348 A1 | 3/2003 | Takagi et al. | |
| 2004/0212013 A1 | 10/2004 | Takagi et al. | |
| 2011/0073863 A1 | 3/2011 | Asanuma et al. | |
| 2012/0094403 A1 | 4/2012 | Nagai et al. | |
| 2013/0001559 A1 | 1/2013 | Kishida et al. | |
| 2013/0126869 A1 * | 5/2013 | Kanegae et al. | 257/57 |
| 2014/0048807 A1 * | 2/2014 | Kanegae et al. | 257/57 |
| 2014/0048813 A1 * | 2/2014 | Kanegae et al. | 257/72 |
| 2014/0138675 A1 * | 5/2014 | Yamazaki | 257/43 |
| 2014/0151691 A1 * | 6/2014 | Matsubayashi et al. | 257/43 |

FOREIGN PATENT DOCUMENTS

| | | |
|---|---|---|
| JP | 2003-303969 | 10/2003 |
| JP | 2005-322845 | 11/2005 |
| JP | 2008-124392 | 5/2008 |
| JP | 4220665 | 11/2008 |
| JP | 2010-287618 | 12/2010 |
| JP | 2011-071440 | 4/2011 |

OTHER PUBLICATIONS

Makoto Yoshimi et al., "Suppression of the Floating-Body Effect in SOI MOSFET's by the Bandgap Engineering Method Using a $Si_{1-x}Ge_x$ Source Structure", IEEE Transactions on Electron Devices, vol. 44, No. 3, pp. 423-430 (Mar. 1997).

* cited by examiner (electron affinity of a-Si is 3.7 eV)

(electron affinity of a-Si is 4.0 eV)

THIN-FILM TRANSISTOR DEVICE AND METHOD FOR MANUFACTURING THIN-FILM TRANSISTOR DEVICE

CROSS REFERENCE TO RELATED APPLICATION

This is a continuation application of International Application No. PCT/JP2011/003749 filed on Jun. 30, 2011, designating the United States of America. The entire disclosure of the above-identified application, including the specification, drawings and claims are incorporated herein by reference in its entirety.

FIELD

One or more exemplary embodiments disclosed herein relate generally to thin-film transistor devices and methods for manufacturing the thin-film transistor devices.

BACKGROUND

In an active-matrix display device such as a liquid crystal display, a thin-film transistor device referred to as a thin-film transistor (TFT) has been used. In the display device, the TFT is used as a switching device for selecting a pixel or a driving transistor for driving the pixel.

In recent years, organic EL displays using electroluminescence (EL) of an organic material have been attracting attention as a type of next-generation flat panel display replacing liquid crystal displays.

Unlike the voltage-driven liquid crystal display, the organic EL display is a current-driven display device. Accordingly, there is an urgent need for development of a thin-film transistor device having excellent on/off-characteristics as a driving circuit for the active-matrix display device. A TFT has a structure in which a gate electrode, a semiconductor layer (channel layer), a source electrode, and a drain electrode are formed on a substrate. The channel layer is typically a silicon thin film.

Moreover, display devices are demanded to increase a screen size and reduce a cost. In general, because of easy cost reduction, bottom-gate TFTs are used. A bottom-gate TFT has a gate electrode formed closer to a substrate more than a channel layer is.

The bottom-gate TFTs are classified into two major categories: channel-etching TFTs in which a channel layer is etched, and channel-stopper TFTs in which a channel layer is prevented from being etched.

In comparison to the channel-stopper TFTs, the channel-etching TFTs can decrease steps of photolithography, thereby reducing a manufacturing cost.

On the other hand, the channel-stopper TFTs can prevent the channel layer from being damaged by etching, thereby suppressing the increase of characteristic variations on the surface of the substrate. Moreover, a channel layer of the channel-stopper TFT can be manufactured to be thinner than that of the channel-stopper TFT. As a result, the channel-stopper TFTs can reduce parasitic resistance components to improve the turn-On characteristics. The channel-stopper TFTs are therefore advantageous for high resolution.

Therefore, the channel-stopper TFTs are suitable as, for example, driving transistors in current-driven organic EL display devices having organic EL elements. Even if a manufacturing cost of the channel-stopper TFTs is higher than that of the channel-etching TFTs, channel-stopper TFTs have been attempted to be applied to pixel circuits in organic EL display devices.

For example, Patent Literature 1 discloses a channel-stopper TFT in which a gate electrode, a gate insulating film, a first semiconductor film composed of an n-type microcrystalline silicon, a second semiconductor film composed of amorphous silicon, and a back channel stopper insulating film are sequentially formed on a substrate in order to suppress back channel effects caused by fixed charges of a channel stopper film.

CITATION LIST

Patent Literature

Patent Literature 1: Japanese Unexamined Patent Application Publication No. 2011-71440

SUMMARY

Technical Problem

However, the structure of the conventional channel-stopper TFT has a problem that, in drain current/drain-to-source voltage (Id-Vds) characteristics, kink phenomenon by which a drain current (Id) is rapidly increased occurs. In particular, this kink phenomenon often occurs when the drain-to-source voltage (Vds) is high.

In order to address the problem, in particular, organic EL display devices or analog circuits which use saturated regions of TFTs cannot use the conventional TFTs disclosed in Patent Literature 1.

As explained above, the conventional TFTs have a problem of TFT characteristic deterioration caused by kink phenomenon.

In order to address the above problems, one non-limiting and exemplary embodiment provides a thin-film transistor device having reliable TFT characteristics with suppressed kink phenomenon and a method for manufacturing the thin-film transistor device.

Solution to Problem

In order to achieve the above object, in one general aspect, the techniques disclosed here feature a thin-film transistor device including: a gate electrode above a substrate; a gate insulating film above the gate electrode; a crystalline silicon thin film above the gate insulating film, the crystalline silicon thin film including a channel region; a plurality of semiconductor films above at least the channel region; an insulating film over the channel region and above the semiconductor films, the insulating film being composed of an organic material; a source electrode over at least an end portion of the insulating film; and a drain electrode over at least an other end portion of the insulating film, the drain electrode facing the source electrode, wherein the semiconductor films include at least a first semiconductor film and a second semiconductor film provided above the first semiconductor film, $E_{CP} < E_{C1}$ where $E_{CP}$ denotes an energy level at a lower end of a conduction band of the crystalline silicon thin film and $E_{C1}$ denotes an energy level at a lower end of a conduction band of the first semiconductor film, the first semiconductor film is provided on the crystalline silicon thin film, and the energy level $E_{CP}$ at the lower end of the conduction band of the crystalline silicon thin film and the energy level $E_{C1}$ at the lower end of the conduction band of the first semiconductor film are adjusted to suppress a spike at a junction between the crystalline silicon thin film and the first semiconductor film.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

The thin-film transistor device and the method for manufacturing the thin-film transistor device can suppress kink phenomenon, thereby offering reliable TFT characteristics.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT(S)

Figure 1:
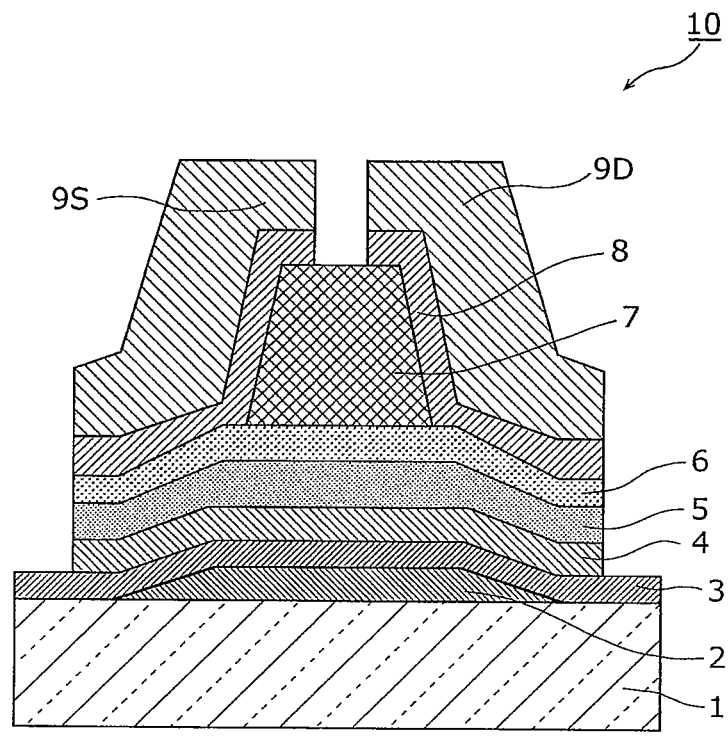
FIG. 1 is a cross-sectional view schematically illustrating a structure of a thin-film transistor device according to one exemplary embodiment.

According to an exemplary embodiment disclosed herein, a thin-film transistor device includes: a gate electrode above a substrate; a gate insulating film above the gate electrode; a crystalline silicon thin film above the gate insulating film, the crystalline silicon thin film including a channel region; a plurality of semiconductor films above at least the channel region; an insulating film over the channel region and above the semiconductor films, the insulating film being composed of an organic material; a source electrode over at least an end portion of the insulating film; and a drain electrode over at least an other end portion of the insulating film, the drain electrode facing the source electrode, wherein the semiconductor films include at least a first semiconductor film and a second semiconductor film provided above the first semiconductor film, $E_{CP} < E_{C1}$ where $E_{CP}$ denotes an energy level at a lower end of a conduction band of the crystalline silicon thin film and $E_{C1}$ denotes an energy level at a lower end of a conduction band of the first semiconductor film, the first semiconductor film is provided on the crystalline silicon thin film, and the energy level $E_{CP}$ at the lower end of the conduction band of the crystalline silicon thin film and the energy level $E_{C1}$ at the lower end of the conduction band of the first semiconductor film are adjusted to suppress a spike at a junction between the crystalline silicon thin film and the first semiconductor film With this, these energy levels at the lower ends of the conduction bands at the junction between the crystalline silicon thin film and the first semiconductor film are continuous. As a result, occurrence of a spike at the junction can be suppressed to suppress occurrence of kink phenomenon.

For example, electron affinity of the first semiconductor film may be different from electron affinity of the second semiconductor film. In this case, it is desirable that the electron affinity of the first semiconductor film is greater than the electron affinity of the second semiconductor film.

With this, these electron affinity are adjusted to easily satisfy $E_{CP}<E_{C1}$.

For example, the first semiconductor film and the second semiconductor film may be semiconductor films made mainly of silicon and have different band gaps. In this case, it is desirable that the band gap of the first semiconductor film is closer to a band gap of the crystalline silicon thin film than the band gap of the second semiconductor film is.

With this, the adjustment of the band gaps easily satisfy $E_{CP}<E_{C1}$.

For example, the first semiconductor film and the second semiconductor film may be amorphous silicon films.

With this, the second semiconductor film can suppress a back channel caused by positive fixed charges included in the insulating film composed of an organic material. Therefore, occurrence of kink phenomenon can be suppressed while forming of the back channel is suppressed.

For example, the first semiconductor film and the second semiconductor film may be semiconductor films made mainly of silicon and have different crystallization ratios. In this case, it is desirable that the crystallization ratio of the first semiconductor film is greater than the crystallization ratio of the second semiconductor film.

With this, it is possible to set the energy levels at the lower ends of the conduction bands to be continuous at the junction between the crystalline silicon thin film and the first semiconductor film. As a result, occurrence of a spike can be suppressed at the junction.

For example, the first semiconductor film may be provided on the crystalline silicon thin film.

With this, the amorphous silicon film formed on and close to the surface of the crystalline silicon thin film takes over the crystallinity of the crystalline silicon thin film to be also crystallized. It is therefore possible to easily set the crystallization ratio of the first semiconductor film as the lower layer to be greater than the crystallization ratio of the second semiconductor film as the upper layer.

For example, the energy level $E_{CP}$ at the lower end of the conduction band of the crystalline silicon thin film and the energy level $E_{C1}$ at the lower end of the conduction band of the first semiconductor film may be adjusted to suppress a spike at a junction between the crystalline silicon thin film and the first semiconductor film. In this case, it is desirable that from the first semiconductor film to the crystalline silicon thin film, there is no barrier between the conduction band of the first semiconductor film and the conduction band of the crystalline silicon thin film.

With this, the thin-film transistor device can suppress kink phenomenon, thereby providing reliable TFT characteristics.

For example, the first semiconductor film may include one of carbon and germanium.

With this, by doping carbon into the first semiconductor film, it is possible to adjust the energy level at the lower end of the conduction band. If germanium is doped in the first semiconductor film, it is possible to adjust an energy level at an upper end of a valence band. As a result, $E_{CP}<E_{C1}$ can be easily satisfied.

According to another exemplary embodiment disclosed herein, a method for manufacturing a thin-film transistor device, the method comprising: preparing a substrate; forming a gate electrode above the substrate; forming a gate insulating film above the gate electrode; forming a crystalline silicon thin film above the gate insulating film, the crystalline silicon thin film including a channel region; forming a plurality of semiconductor films above at least the channel region; forming an insulating film composed of an organic material over the channel region and above the semiconductor films; and a source electrode over at least an end portion of the insulating film, and forming a drain electrode over at least an other end portion of the insulating film to face the source electrode, wherein, in the forming of the semiconductor films, at least a first semiconductor film and a second semiconductor film are formed, the first semiconductor film being formed on the crystalline silicon thin film, and the second semiconductor film being formed above the first semiconductor film, in the forming of the semiconductor films, $E_{CP}<E_{C1}$ where $E_{CP}$ denotes an energy level at a lower end of a conduction band of the crystalline silicon thin film and $E_{C1}$ denotes an energy level at a lower end of a conduction band of the first semiconductor film, in the forming of the semiconductor films, the first semiconductor film and the second semiconductor film are formed by setting the energy level $E_{CP}$ at the lower end of the conduction band of the crystalline silicon thin film and the energy level $E_{C1}$ at the lower end of the conduction band of the first semiconductor film to suppress a spike at a junction between the crystalline silicon thin film and the first semiconductor film.

In this way, a semiconductor layer including the crystalline silicon thin film, the first semiconductor film, and the second semiconductor film can be formed to cause these energy levels at the lower ends of the conduction bands at the junction between the crystalline silicon thin film and the first semiconductor film to be continuous. As a result, occurrence of a spike at the junction can be suppressed to manufacture a thin-film transistor device with suppressed occurrence of kink phenomenon.

For example, in the forming of the semiconductor films, the first semiconductor film and the second semiconductor film may be formed by setting electron affinity of the first semiconductor film to be different from electron affinity of the second semiconductor film. In this case, it is desirable that in the forming of the semiconductor films, the first semiconductor film and the second semiconductor film are formed by setting the electron affinity of the first semiconductor film to be greater than the electron affinity of the second semiconductor film.

In this way, it is possible to form the semiconductor layer easily satisfying $E_{CP}<E_{C1}$.

For example, the first semiconductor film and the second semiconductor film may be semiconductor films made mainly of silicon, and in the forming of the semiconductor films, the first semiconductor film and the second semiconductor film may be formed to have different band gaps. In this case, it is desirable that in the forming of the semiconductor films, the first semiconductor film and the second semiconductor film are formed by setting the band gap of the first semiconductor film to be closer to a band gap of the crystalline silicon thin film than the band gap of the second semiconductor film is.

In this way, it is possible to form the semiconductor layer easily satisfying $E_{CP}<E_{C1}$.

For example, in the forming of the semiconductor films, the first semiconductor film and the second semiconductor film may be to amorphous silicon films.

In this way, it is possible to manufacture a thin-film transistor in which occurrence of kink phenomenon as well as forming of a back channel are suppressed.

For example, the first semiconductor film and the second semiconductor film may be semiconductor films made mainly of silicon, and in the forming of the semiconductor films, the first semiconductor film and the second semiconductor film may be formed to have different crystallization ratios. In this case, it is desirable that in the forming of the semiconductor films, the first semiconductor film and the second semiconductor film are formed by setting the crystallization ratio of the first semiconductor film to be greater than the crystallization ratio of the second semiconductor film.

In this way, it is possible to form the semiconductor layer in which the energy levels at the lower ends of the conduction bands at the junction between the crystalline silicon thin film and the first semiconductor film are continuous.

For example, in the forming of the semiconductor films, the first semiconductor film may be provided on the crystalline silicon thin film.

In this way, crystallization is progressed for the amorphous silicon film formed on and close to the surface of the crystalline silicon thin film serving as an under-layer. It is easily possible to cause the crystallization ratio of the first semiconductor film as a lower layer to be greater than the crystallization ratio of the second semiconductor film as an upper layer.

For example, in the forming of the semiconductor films, the first semiconductor film may include one of carbon and germanium.

In this way, by doping carbon into the first semiconductor film, it is possible to adjust the energy level at the lower end of the conduction band. If germanium is doped in the first semiconductor film, it is possible to adjust an energy level at an upper end of a valence band. In this way, it is possible to form the semiconductor layer easily satisfying $E_{CP}<E_{C1}$.

For example, in the forming of the semiconductor films, the first semiconductor film and the second semiconductor film may be formed continuously in a same vacuum apparatus.

In this way, it is possible to simultaneously form the first semiconductor film and the second semiconductor film which satisfy $E_{CP}<E_{C1}$. In particular, it is possible to continuously form the first semiconductor film and the second semiconductor film having different crystallization ratios.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Hereinafter, certain exemplary embodiments are described in greater detail with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents.

Therefore, among the structural elements in the following exemplary embodiments, structural elements not recited in any one of the independent claims are described as arbitrary structural elements.

Embodiment

The following shall describe a thin-film transistor device and a method for manufacturing the thin-film transistor device according to an embodiment. However, the present disclosure is defined based on the recitations in Claims. Accordingly, among components in the embodiment, the components not recited in Claims are not necessary for solving the problem, but composes a more preferable embodiment. Note that, the diagrams are schematic diagrams, and the illustration is not always strictly accurate.

(Structure of Thin-Film Transistor Device)

First, the structure of the thin-film transistor device 10 according to the present embodiment shall be described with reference to FIG. 1. FIG. 1 is a cross-sectional view schematically illustrating the structure of the thin-film transistor device according to the present embodiment.

As illustrated in FIG. 1, the thin-film transistor device 10 according to the present embodiment is a bottom-gate thin-film transistor device. The thin-film transistor device 10 includes: a substrate 1; and a gate electrode 2, a gate insulating film 3, a crystalline silicon thin film 4, a first semiconductor film 5, a second semiconductor film 6, an insulating film 7 above a channel region, a pair of contact layers 8, and a pair of a source electrode 9S and a drain electrode 9D, all of which are sequentially formed above the substrate 1. The following shall describe the components of the thin-film transistor device 10 according to the present embodiment in detail.

The substrate 1 is a glass substrate made of, for example, a glass material such as silica glass, alkali-free glass, or highly heat-resistant glass. An undercoat layer composed of a silicon nitride ($SiN_x$) film, a silicon oxide ($SiO_y$) film, a silicon oxynitride ($SiO_yN_x$) film, or others may be formed on the substrate 1 in order to prevent impurity such as sodium and phosphorus in the glass substrate from entering the crystalline silicon thin film 4. In addition, the undercoat layer also functions as a layer for buffering the heat on the substrate 1 in a high-temperature thermal treatment process such as laser annealing. The thickness of the undercoat layer may be, for example, approximately 100 nm to 2000 nm.

The gate electrode 2 is patterned on the substrate 1 in a predetermined shape. The gate electrode 2 may have a single-layer structure or a multi-layer structure of that is made of a conductive material, an alloy including the material, or the like, and is made of, for example, molybdenum (Mo), aluminum (Al), copper (Cu), tungsten (W), titanium (Ti), chromium (Cr), and molybdenum-tungsten (MoW), for example. The thickness of the gate electrode 2 may be, for example, approximately 20 nm to 500 nm.

The gate insulating film 3 is provided on the gate electrode 2. In the present embodiment, the gate insulating film 3 is provided on/above the entire top surface of the substrate 1 to cover the gate electrode 2. The gate insulating film 3 may be, for example, a single-layer film of silicon oxide ($SiO_y$), silicon nitride ($SiN_x$), a silicon oxynitride ($SiO_yN_x$) film, aluminum oxide ($AlO_2$), or tantalum oxide ($TaO_w$), or a multi-layer film of at least two of these materials. The thickness of the gate insulating film 3 may be, for example, 50 nm to 300 nm.

In the present embodiment, the crystalline silicon thin film 4 is included as a semiconductor layer serving as a TFT channel layer. Accordingly, silicon oxide is desirably used for the gate insulating film 3. The reason for this is that it is desirable to have good interface state between the crystalline silicon thin film 4 and the gate insulating film 3 for maintaining reliable threshold voltage characteristics of the TFT, and silicon oxide is suitable for this purpose.

The crystalline silicon thin film 4 is a semiconductor layer provided on the gate insulating film 3, having a predetermined channel region in which movement of carriers are controlled by the voltage at the gate electrode 2. A TFT channel length is defined as a width of the insulating film 7 serving as a channel-stopper layer.

The crystalline silicon thin film 4 is a crystalline silicon thin film having a crystalline structure, and is a microcrystalline silicon thin film or a polycrystalline silicon thin film. The crystalline silicon thin film 4 may be formed by crystallizing amorphous silicon having amorphous characteristics, for example. It is also possible that the crystalline silicon thin film 4 is a silicon thin film having a mixed crystalline structure of amorphous silicon and crystalline silicon. In this case, in order to produce reliable turn-On characteristics, at least the predetermined channel region of the crystalline silicon thin film 4 desirably has crystalline silicon more than amorphous silicon. The thickness of the crystalline silicon thin film 4 may be, for example, approximately 20 nm to 100 nm. The silicon crystal in the crystalline silicon thin film 4 desirably has a principal surface orientation of [100]. With the structure, the crystalline silicon thin film 4 has reliable crystallinity.

An average grain size of the crystalline silicon in the crystalline silicon thin film 4 is approximately 5 nm to 1000 nm. The crystalline silicon thin film 4 includes the above-described poly-crystal having an average grain size of at least 100 nm, or a so-called micro-crystal (pc) having an average grain size of at least 10 nm and smaller than 100 nm.

Like the crystalline silicon thin film 4 as being a semiconductor layer, a set of the first semiconductor film 5 and the second semiconductor film 6 is also a semiconductor layer, and provided above the crystalline silicon thin film 4. This semiconductor layer is a multi-layer film including a plurality of semiconductor films. In the present embodiment, the semiconductor layer includes two films: the first semiconductor film 5 and the second semiconductor film 6.

The first semiconductor film 5 is provided on the crystalline silicon thin film 4, being in contact with the top surface of the crystalline silicon thin film 4. The second semiconductor film 6 is sequentially formed on the first semiconductor film 5. Each of the first semiconductor film 5 and the second semiconductor film 6 has a thickness of approximately 20 nm. The thickness of the first semiconductor film 5 desirably ranges between 10 nm and 100 nm. The thickness of the second semiconductor film 6 desirably ranges between 10 nm and 40 nm.

Here, when energy levels at lower ends of conduction bands of the crystalline silicon thin film 4 and the first semiconductor film 5 are represented as $E_{CP}$ and $E_{C1}$, respectively, the crystalline silicon thin film 4 and the first semiconductor film 5 satisfy a relationship $E_{CP} < E_{C1}$.

In the present embodiment, the first semiconductor film 5 and the second semiconductor film 6 have different electron affinity. In this case, it is desirable that the electron affinity of the first semiconductor film 5 is greater than the electron affinity of the second semiconductor film 6. The electron affinity of a semiconductor film refers to a difference between a vacuum level and an energy level at a lower end of a conduction band. This means that the electron affinity can be used to adjust the energy level at the lower end of the conduction band of the semiconductor film.

In the present embodiment, the first semiconductor film 5 and the second semiconductor film 6 have different crystallization ratios. In this case, it is desirable that the crystallization ratio of the first semiconductor film 5 is greater than the crystallization ratio of the second semiconductor film 6. The above setting of the crystallization ratios can easily result in the relationship of $E_{CP} < E_{C1}$. The first semiconductor film 5 according to the present embodiment includes crystalline silicon grains each having a crystalline grain size ranging from 5 nm to 1000 nm. The crystallization ratio in a thickness direction of the first semiconductor film 5 is gradually increased as being closer to the crystalline silicon thin film 4. In the present embodiment, the crystalline grain size of the crystalline silicon grains in the first semiconductor film 5 is gradually increased as being closer to the crystalline silicon thin film. On the other hand, the second semiconductor film 6 according to the present embodiment is not crystallized and therefore has a crystallization ratio of zero.

The crystallization ratio refers to a degree of crystallizing the silicon semiconductor film structure if the semiconductor film is made mainly of silicon. For example, the crystallization ratio may be expressed by a crystalline grain size as described above, a density degree of the same crystalline grain size, or the like. The crystallization ratio may be a crystallization ratio of crystal components only, or a crystallization ratio of crystal components to amorphous components.

In the present embodiment, each of the first semiconductor film 5 and the second semiconductor film 6 is an amorphous silicon film (intrinsic amorphous silicon) in which impurity has not been doped purposely. For example, it is possible in the already-manufactured TFT that the first semiconductor film 5 and the second semiconductor film 6 are still amorphous silicon films and have different energy levels at lower ends of the respective conduction bands. It is also possible that one of the first semiconductor film 5 and the second semiconductor film 6 is an amorphous silicon film and the other is a crystalline silicon thin film including crystalline silicon, and the first semiconductor film 5 and the second semiconductor film 6 have different energy levels at lower ends of the respective conduction bands. Although an amorphous silicon film is generally composed of amorphous components only, the amorphous silicon film according to the present embodiment includes also crystalline components.

The insulating film 7 is a channel-stopper film that protects the semiconductor layers including the channel region (the crystalline silicon thin film 4, the first semiconductor film 5, and the second semiconductor film 6). More specifically, the insulating film 7 functions as a Channel Etching Stopper (CES) layer with a function of preventing the crystalline silicon thin film 4, the first semiconductor film 5, and the second semiconductor film 6 from being etched in the etching process of forming the pair of contact layers 8.

The insulating film 7 is provided above the channel region and above the first semiconductor film 5 and the second semiconductor film 6. In the present embodiment, the insulating film 7 is provided immediately on a part of the second semiconductor film 6 which corresponds to the channel region (in other words, provided over the channel region).

The insulating film 7 is an organic material layer made of an organic material mainly including organic materials such as silicon, oxygen, and carbon. In the present embodiment, the insulating film 7 may be formed by patterning a photosensitive-coated organic material and solidifying the organic material. The organic material of the insulating layer 7 is, for example, an organic resin material, a surface activating agent, a solvent, and a photosensitizing agent.

As an organic resin material which is a major component of the insulating layer 7, photosensitive or non-photosensitive organic resin material composed of one or more of polyimide, acrylic, polyamide, polyimide-amide, resist, and benzocyclobutene may be used. As the surface activating agent, a surface activating agent composed of a silicon compound such as siloxane may be used. As the solvent, an organic solvent such as propyleneglycol monomethylether acetate or 1,4-dioxane may be used. As the photosensitizing agent, a positive photosensitizing agent such as naphthoquinone diazide may be used. Note that, the photosensitizing agent includes not only carbon, but also sulfur.

When the insulating layer 7 is formed, the above-described organic material may be formed by a coating method such as the spin coating. Other than the coating method, the insulating layer 7 may be formed by a method such as the liquid drop ejection method. An organic material may be selectively formed in a predetermined shape by using a printing method such as the screen printing or the offset printing which allow formation of the predetermined pattern.

The thickness of the insulating layer 7 may be 300 nm to 1000 nm, for example. The minimum thickness of the insulating layer 7 is determined in consideration of a margin caused by etching, suppression of influence on the fixed charges in the insulating layer 7, and so on. The maximum thickness of the insulating layer 7 is determined for suppressing the reduction in the process reliability caused by increase of height differences of the contact layer 8, the source electrode 9S, and the drain electrode 9D.

The contact layers 8 in the pair are amorphous semiconductor layers having impurity at high concentration, and are provided over the channel region of the crystalline silicon thin film 4 via the insulating layer 7. The contact layers 8 in the pair face each other with a predetermined distance.

In the present embodiment, one of the contact layers 8 in the pair is provided over one end portion of the insulating film 7 and a part of the second semiconductor film 6 close to the end portion of the insulating film 7, covering the top surface and the side surface of the end portion of the insulating film 7 and the top surface of the part of the second semiconductor film 6. The other one of the contact layers 8 in the pair is provided over the other end portion of the insulating film 7 and another part of the second semiconductor film 6 closer to the other end portion of the insulating film, covering the top surface and the side surface of the other end portion of the insulating film 7 and the top surface of the other part of the second semiconductor film 6.

Each of the contact layers 8 in the pair may be, for example, an n-type semiconductor film formed by doping phosphorus (P) as impurity into amorphous silicon, and be an $n^+$ layer including high-concentration impurity at $1\times10^{19}$ (atm/cm$^3$) or more. The thickness of each of the contact layers 8 is, for example, 5 nm to 100 nm.

Note that, the pair of the contract layers 8 may be two layers: a lower low-concentration electric field limiting layer ($n^-$ layer) and an upper high-concentration contact layer ($n^+$ layer). The low-concentration electric field limiting layer is doped with phosphorus of approximately $1\times10^{17}$ (atm/cm$^3$). The above-described two layers may be continuously formed by a Chemical Vapor Deposition (CVD) apparatus.

The source electrode 9S and the drain electrode 9D in a pair are provided over the channel region of the crystalline silicon thin film 4, being positioned on the respective contact layers 8 which are provided on the respective end portions and side surfaces of the insulating film 7. The source electrode 9S and the drain electrode 9D in the pair face each other with a predetermined distance.

The source electrode 9S is provided over an end portion of the insulating layer 7 (one end portion) and a part of the second semiconductor film 6, so that one of the contact layers 8 is sandwiched between the source electrode 9S and the end portion or the part of the second semiconductor film 6. The drain electrode 9D is provided over the other end portion of the insulating layer 7 and another part of the second semiconductor film 6, so that the other one of the contract layers 8 is sandwiched between the drain electrode 9S and the other end portion or the other part of the second semiconductor film 6.

In the present embodiment, each of the source electrode 9S and the drain electrode 9D may have a single-layer structure or multilayer structure that is made of a conductive material, an alloy including the material, or the like, and is made of, for example, aluminum (Al), molybdenum (Mo), tungsten (W), copper (Cu), titanium (Ti), and chromium (Cr). In the present embodiment, each of the source electrode 9S and the drain electrode 9D may have a three-layer structure of MoW/Al/MoW. The thickness of each of the source electrode 9S and the drain electrode 9D may be, for example, approximately 100 nm to 500 nm.

Next, the description is given for effects of the thin-film transistor device 10 according to the present embodiment and how to achieve the present embodiment.

A channel-stopper thin-film transistor device has positive fixed charges in an insulating film serving as a channel stopper layer. In particular, a coated channel-stopper layer made of organic material includes more positive fixed charges than a channel-stopper layer made of inorganic material, such as $SiO_2$, does. Therefore, the fixed charges form a back channel in the channel layer (crystalline silicon thin film), thereby causing a leak current to deteriorate the turn-Off characteristics. Here, the back channel refers to a path of parasitic current flowing from the source electrode towards the drain electrode via a region around an interface between the channel layer and the channel stopper layer.

Figure 2:
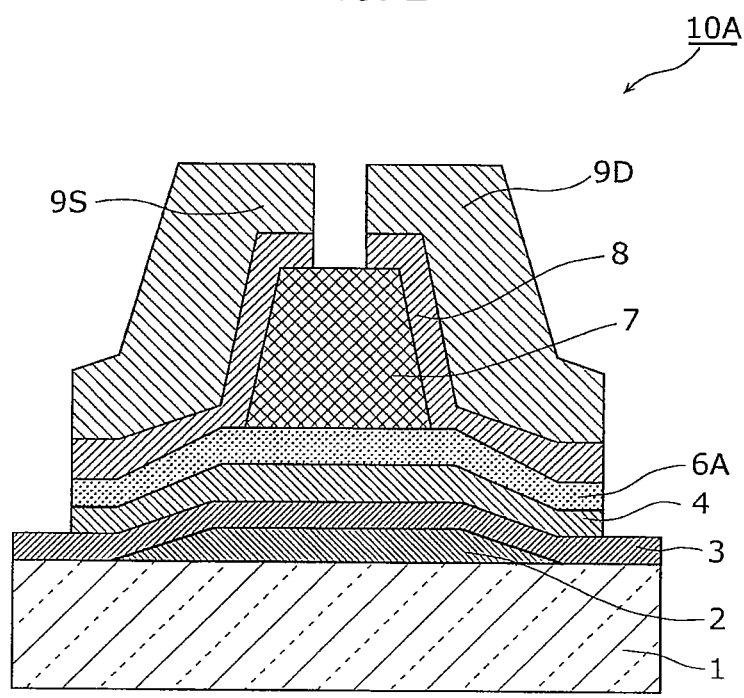
FIG. 2 is a cross-sectional view schematically illustrating a structure of a thin-film transistor device according to a comparative example.

It is therefore considered that, as illustrated in FIG. 2, such a channel-stopper thin-film transistor device is provided with a semiconductor film composed of an amorphous silicon film between the channel layer (crystalline silicon thin film) and the channel stopper layer. FIG. 2 is a cross-sectional view schematically illustrating a structure of a thin-film transistor device according to a comparative example. The same reference numerals in FIG. 1 are assigned to the identical structural elements in FIG. 2.

As illustrated in FIG. 2, the thin-film transistor device 10A according to the comparative example includes, as a back channel layer, a semiconductor film 6A composed of an amorphous silicon film between the crystalline silicon thin film 4 composed of a polycrystalline silicon thin film and the insulating film 7 serving as a channel stopper layer. Therefore, the structure of the thin-film transistor device 10A according to the comparative example differs from the structure of the thin-film transistor device 10 according to the present embodiment in that the first semiconductor film 5 is eliminated from the semiconductor layer.

The structure of the thin-film transistor device 10A according to the comparative example can shield an electric field by cancelling positive fixed charges in the insulating film 7 by a charge density of negative carriers at a localized level density (trap density) of the semiconductor film 6A (amorphous silicon film). It is therefore possible to suppress formation of the back channel to suppress a leak current at the time of turning Off. Thereby, the turn-Off characteristics can be improved.

It has been found, however, that the thin-film transistor device 10A according to the comparative example illustrated in FIG. 2 causes kink phenomenon in the drain current/drain-to-source voltage (Id-Vds) characteristics.

Therefore, the inventors of the present disclosure have examined the reasons of the kink phenomenon occurrence. As a result, it has been found that the amorphous silicon film introduced to suppress the back channel formation causes the kink phenomenon. The following describes the examination results with reference to FIGS. 3A, 3B, 4A, 4B, and 5.

Figure 3A:
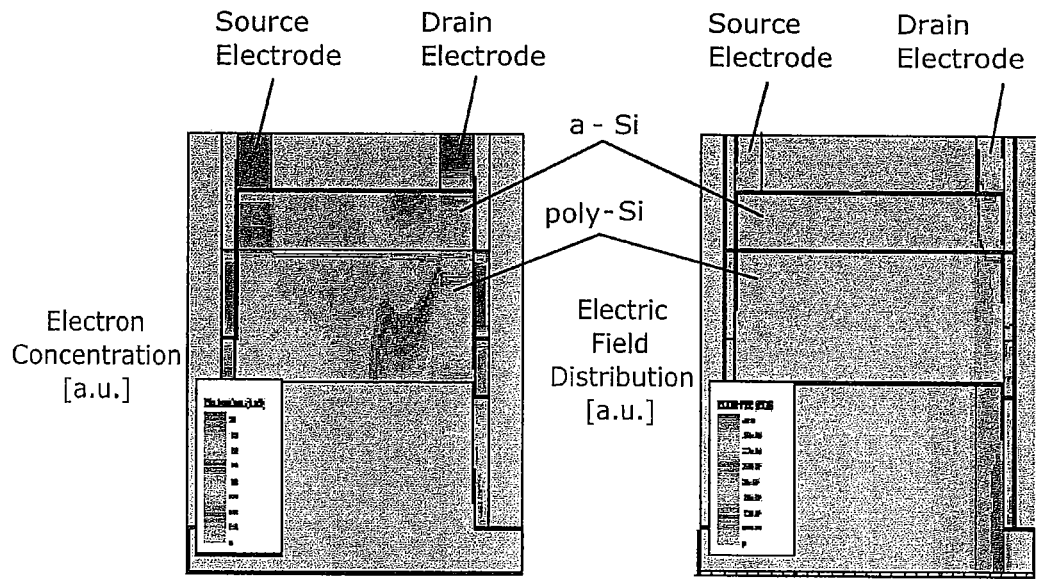
FIG. 3A is a diagram illustrating electron concentration and electric field distribution of a semiconductor layer in a thin-film transistor device in which polyclystalline silicon thin film and an amorphous silicon film (electron affinity=3.7 eV) are used as semiconductor layers.
Figure 3B:
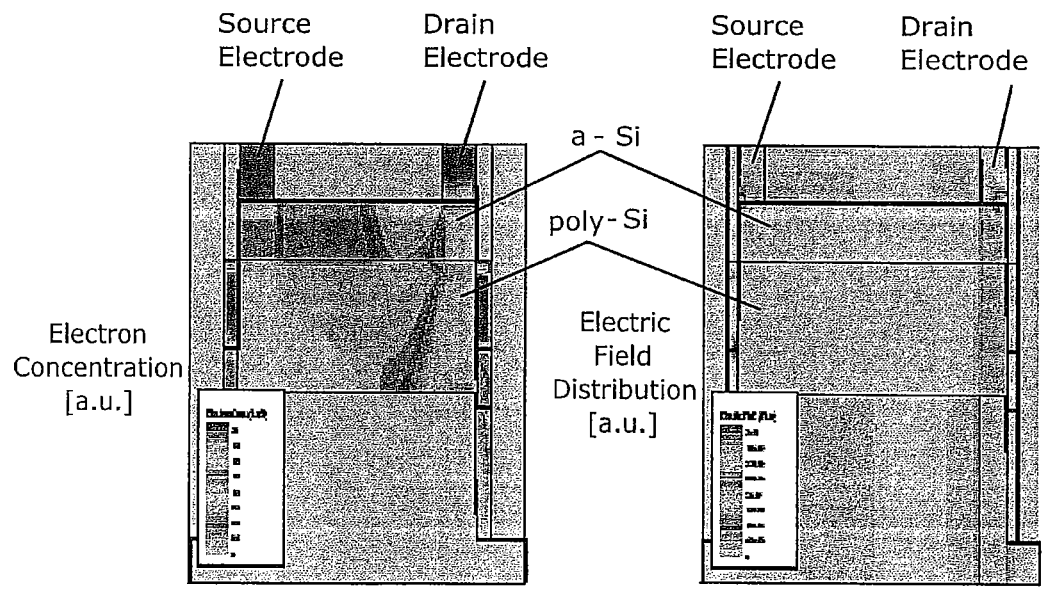
FIG. 3B is a diagram illustrating electron concentration and electric field distribution of a semiconductor layer in a thin-film transistor device in which polyclystalline silicon thin film and an amorphous silicon film (electron affinity=4.0 eV) are used as semiconductor layers.
Figure 4A:
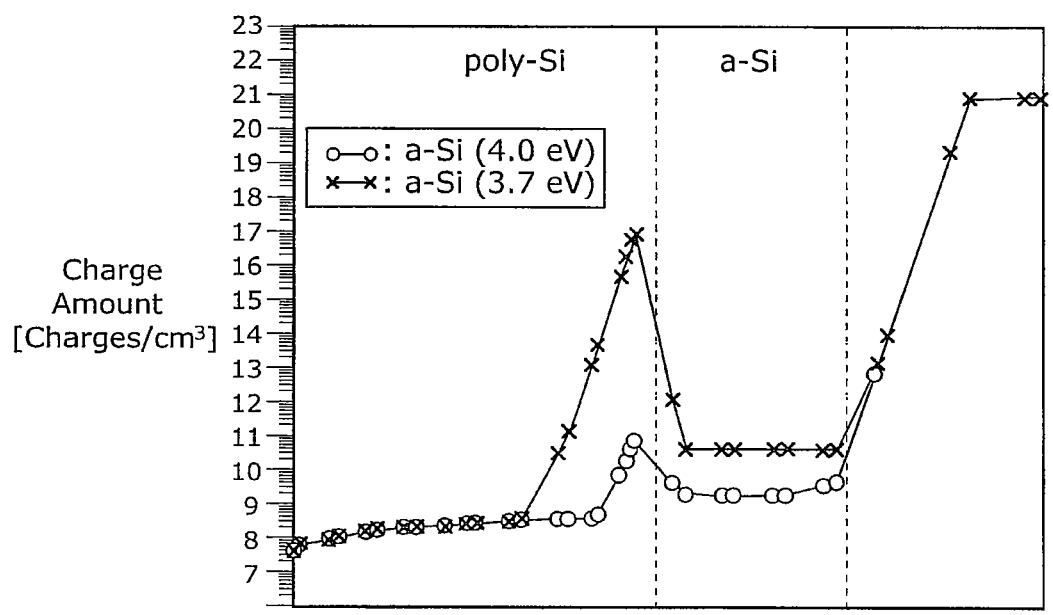
FIG. 4A is a graph plotting a charge amount of the semiconductor layer in the thin-film transistor device corresponding to FIGS. 3A and 3B.
Figure 4B:
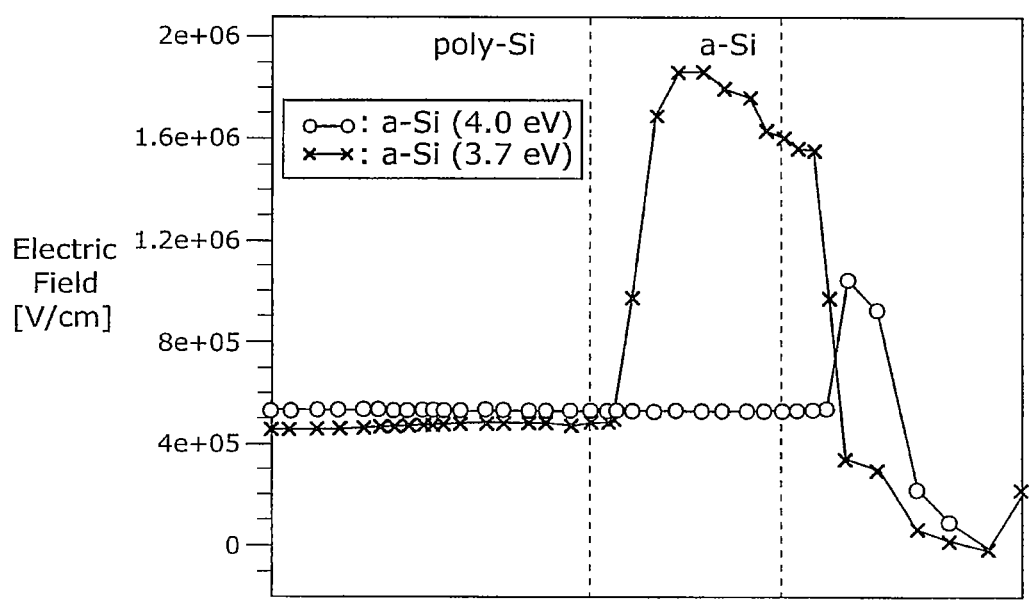
FIG. 4B is a graph plotting an electric filed of the semiconductor layer in the thin-film transistor device corresponding to FIGS. 3A and 3B.
Figure 5:
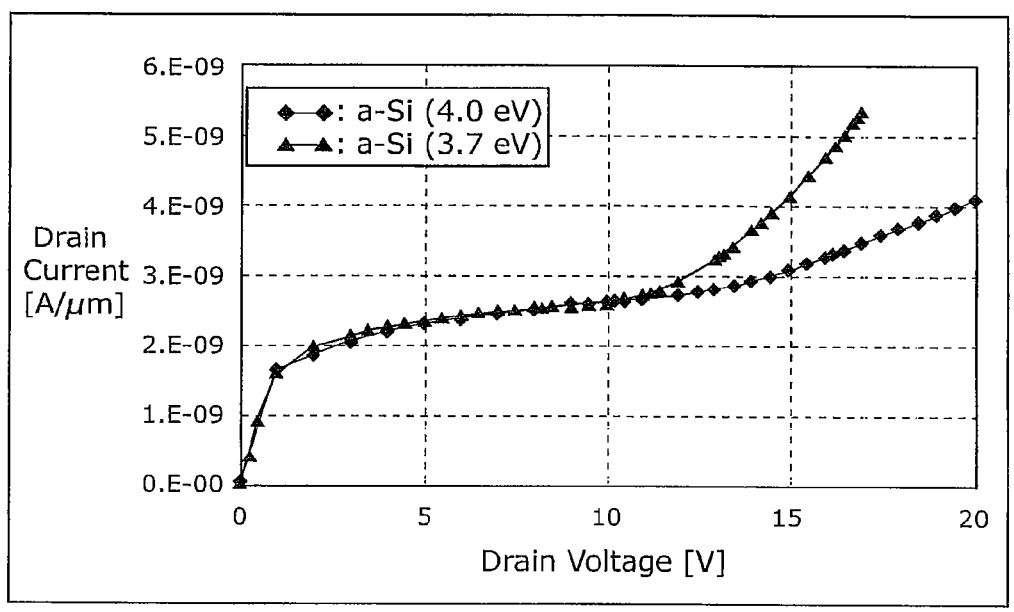
FIG. 5 is a graph plotting a relationship between a drain current and a drain-to-source voltage of the thin-film transistor device corresponding to FIGS. 3A and 3B.

Here, each of FIGS. 3A and 3B illustrates an electron concentration and electric field distribution of a semiconductor layer in a thin-film transistor device including, as the semiconductor layer, a polycrystalline silicon thin film (Poly-Si) and an amorphous silicon film (a-Si). FIG. 4A plots an amount of charges in the semiconductor layer in the thin-film transistor device corresponding to FIGS. 3A and 3B. FIG. 4B plots an electric field of the semiconductor layer in the thin-film transistor device corresponding to FIGS. 3A and 3B. FIG. 5 is a graph plotting a relationship between a drain current and a source-to-drain voltage at the thin-film transistor device corresponding to FIGS. 3A and 3B.

As illustrated in FIGS. 3A and 3B, in the thin-film transistor device having a two-layer structure of the polycrystalline silicon thin film and the amorphous silicon film, in the case where the amorphous silicon film has electron affinity of 3.7 eV (FIG. 3A), an electron density at a lower portion of the drain electrode is higher and an electric filed is therefore concentrated, in comparison to the case where the amorphous silicon film has an electron affinity of 4.0 eV (FIG. 3B). Note that the polycrystalline silicon thin film has an electron affinity of 4.12 eV.

As illustrated in FIG. 4A, in the case where the amorphous silicon film has the electron affinity of 3.7 eV (FIG. 3A), more electric charges are accumulated at the interface between the polycrystalline silicon thin film and the amorphous silicon film in comparison to the case where the amorphous silicon film has the electron affinity of 4.0 eV (FIG. 3B).

Furthermore, as illustrated in FIG. 4B, in the case where the amorphous silicon film has the electron affinity of 3.7 eV (FIG. 3A), the amorphous silicon film has an electric field that is several times as stronger as an electric field in the case where the amorphous silicon film has the electron affinity of 4.0 eV (FIG. 3B).

Then, as illustrated in FIG. 5, kink phenomenon occurs in the case where the amorphous silicon film has the electron affinity of 3.7 eV (FIG. 3A), in particular, in the case of high Vds. On the other hand, in the case where the amorphous silicon film has the electron affinity of 4.0 eV (FIG. 3B), kink phenomenon is suppressed in comparison to the case where the amorphous silicon film has the electron affinity of 3.7 eV (FIG. 3A).

As described above, it has been found that the electron affinity of the amorphous silicon film varies kink phenomenon when the semiconductor layer in the thin-film transistor device has a multi-layer structure of the polycrystalline silicon thin film and the amorphous silicon film. In particular, if the electron affinity of the amorphous silicon film is low, in other words, if the electron affinity of the amorphous silicon film is different from the electron affinity of the polycrystalline silicon thin film, kink phenomenon occurs even at a low drain-to-source voltage (Vds).

According to the above-described examination results, it has been found that kink phenomenon can be suppressed by adjusting the electron affinity of the amorphous silicon film. It has also been found that kink phenomenon can be suppressed by approximating the electron affinity of the amorphous silicon film to the electron affinity of the polycrystalline silicon thin film. Since electron affinity is, as described previously, a difference between a vacuum level and an energy level $E_c$ at a lower end of a conduction band, it is possible to suppress kink phenomenon by adjusting an energy level at a lower end of a conduction band of the amorphous silicon film.

On the other hand, as described earlier, the amorphous silicon film provided between the polycrystalline silicon thin film and the insulating film serving as the channel stopper layer has a function of suppressing a back channel caused by positive fixed charges included in the channel stopper layer. Therefore, when the electron affinity of the amorphous silicon film or the energy level at the lower end of the conduction band of the amorphous silicon film is merely adjusted to suppress kink phenomenon, the back channel suppression effects of the amorphous silicon film are reduced. As a result, opposite effects would occur, deteriorating the TFT characteristics.

In order to address this, the inventors of the present disclosure have conceived as illustrated in FIG. 1 that the crystalline silicon thin film 4 and the first semiconductor film 5 are included as a semiconductor layer positioned between the insulating film 7 serving as a channel stopper layer and the gate insulating film 3, and respective energy levels at lower ends of conduction bands of these semiconductor films are set to satisfy a relationship of $E_{CP} < E_{C1}$. As a result, kink phenomenon can be suppressed.

Figure 6:
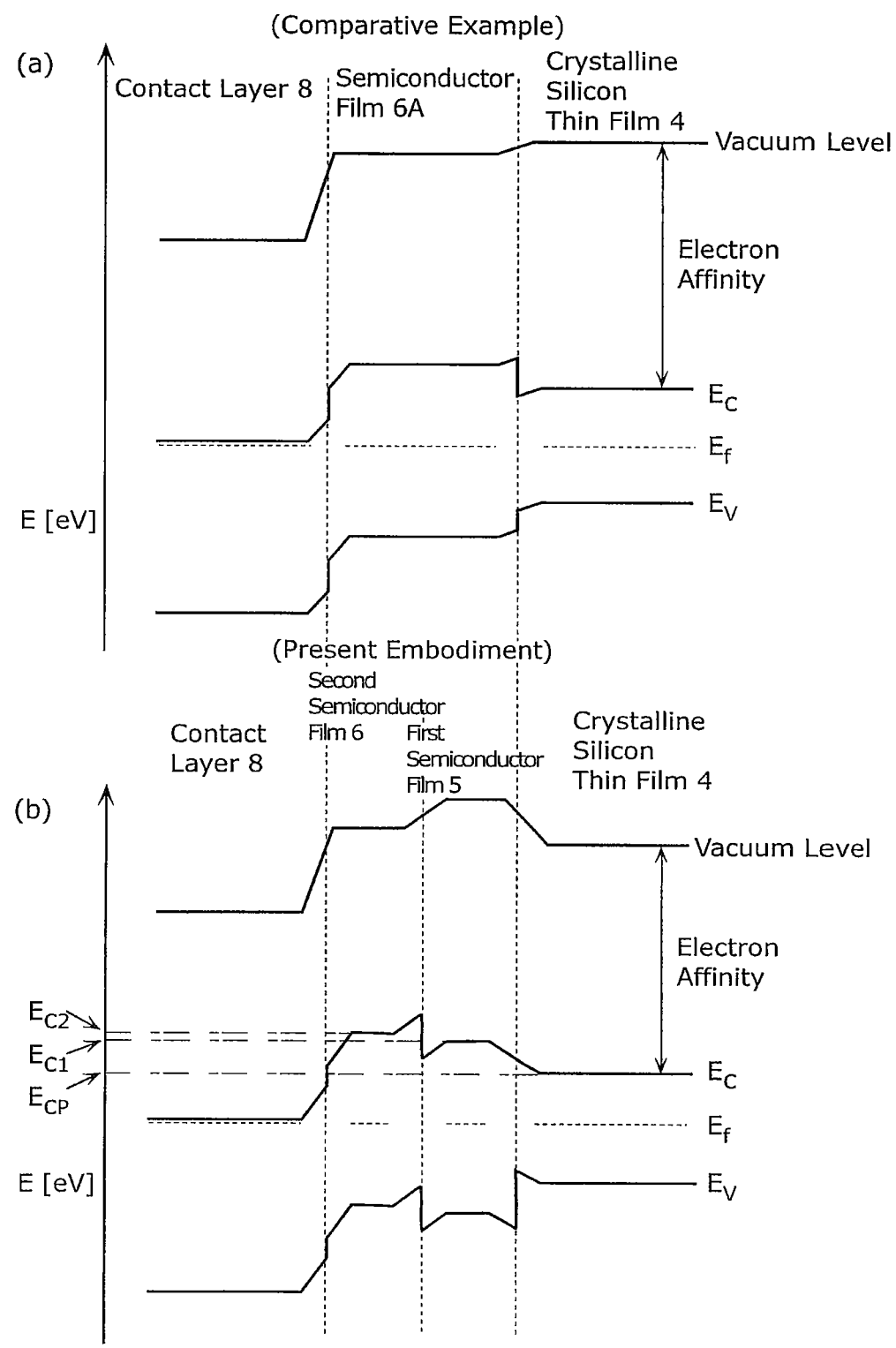
FIG. 6 illustrates (a) a diagram of an energy band of a semiconductor film of the thin-film transistor device (present embodiment) according to the exemplary embodiment illustrated in FIG. 1 and (b) a diagram of an energy band of a semiconductor film of the TFT (comparative example) according to the comparative example illustrated in FIG. 2.
Figure 7A:
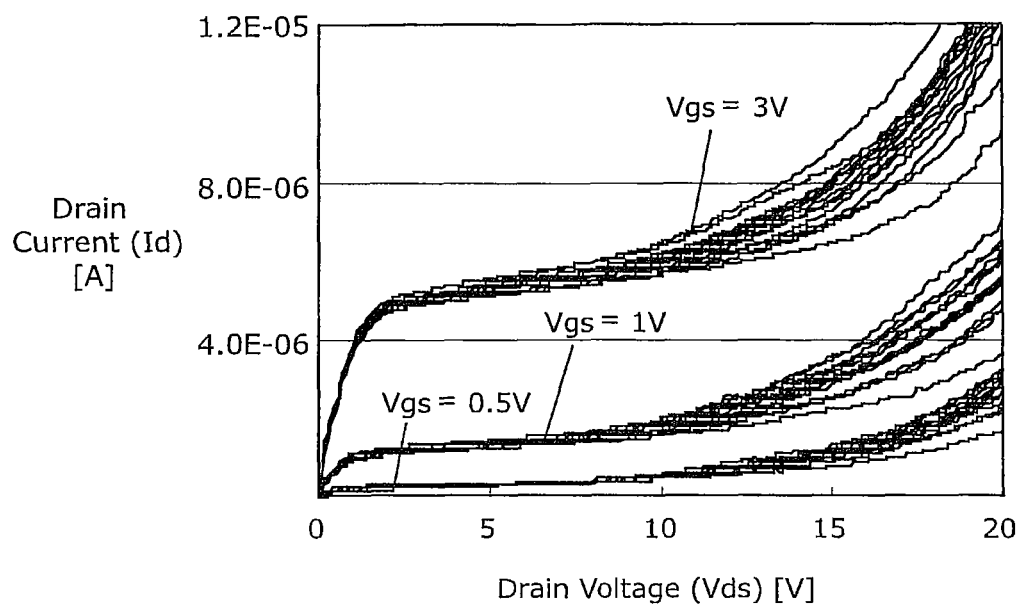
FIG. 7A is a graph plotting a relationship of a drain current (Id) to a drain voltage (Vds) in the thin-film transistor device corresponding to the comparative example.
Figure 7B:
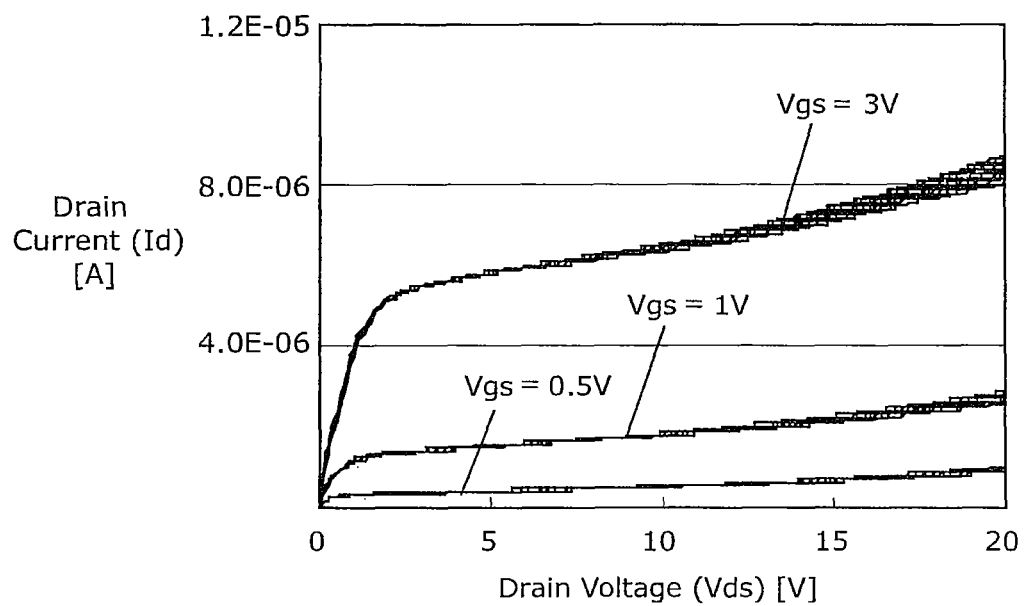
FIG. 7B is a graph plotting a relationship of a drain current (Id) to a drain voltage (Vds) in the thin-film transistor device corresponding to the exemplary embodiment.

Next, the effects of kink phenomenon suppression are described in comparison to the thin-film transistor device 10A according to the comparative example with reference to FIGS. 6, 7A, and 7B. FIG. 6 illustrates (a) a diagram of an energy band of the semiconductor film in the thin-film transistor device (present embodiment) according to the present embodiment illustrated in FIG. 1 and (b) a diagram of an energy band of the semiconductor film of the thin-film transistor device (comparative example) according to the comparative example illustrated in FIG. 2. In FIG. 6, $E_c$ represents an energy level at a lower end of a conduction band, $E_f$ represents a fermi level, and $E_v$ represents an energy level at an upper end of a valence band. FIG. 7A is a graph plotting a relationship of a drain current (Id) to a drain voltage (Vds) in the thin-film transistor device according to the comparative example. FIG. 7B is a graph plotting a relationship of a drain current (Id) to a drain voltage (Vds) in the thin-film transistor device according to the present embodiment.

As illustrated in FIG. 6 (a), in the thin-film transistor device 10A according to the comparative example, a band gap of the semiconductor film 6A is greater than a band gap of the crystalline silicon thin film 4. The energy level $E_c$ at the lower end of the conduction band is higher in the semiconductor film 6A than in the crystalline silicon thin film 4. The electron affinity is greater in the crystalline silicon thin film 4 than in the semiconductor film 6A. Therefore, in the thin-film transistor device 10A according to the comparative example, at the junction between the crystalline silicon thin film 4 and the semiconductor film 6A, there is a great difference of the energy level $E_c$ at the lower end of the conduction band between the crystalline silicon thin film 4 and the semiconductor film 6A. A sharp discontinuous portion (spike) thereby appears at the junction. As a result, as described above, charges are accumulated at the junction between the crystalline silicon thin film 4 and the semiconductor film 6A to cause a strong electric field in the semiconductor film 6A, and as illustrated in FIG. 7, kink phenomenon occurs. In particular, as the gate voltage (Vgs) is higher, more kink phenomenon occurs at a lower drain voltage (Vds).

In contrast, as illustrated in FIG. 6 (b), in the thin-film transistor device 10 according to the present embodiment, the energy level $E_c$ at the lower end of the conduction band of the first semiconductor film 5 positioned between the crystalline silicon thin film 4 and the second semiconductor film 6 is set to be greater than the energy level $E_c$ at the lower end of the conduction band of the crystalline silicon thin film 4.

Therefore, the respective energy levels at the lower ends of the conduction bands of the crystalline silicon thin film 4 and the first semiconductor film 5 are continuous at the junction between the crystalline silicon thin film 4 and the first semiconductor film 5. From the first semiconductor film 5 to the crystalline silicon thin film 4, there is thereby no barrier (potential barrier) between the conduction band of the first semiconductor film 5 and the conduction band of the crystalline silicon thin film 4, so that the conduction bands are smoothly connected. As a result, in the thin-film transistor device 10 according to the present embodiment, no spike occurs at the junction between the crystalline silicon thin film 4 and the first semiconductor film 5. It is therefore possible to suppress the kink phenomenon occurrence as illustrated in FIG. 7B.

As described above, in the thin-film transistor device 10 according to the present embodiment, the first semiconductor film 5 functions as a conduction band adjustment layer to adjust an energy level at a lower end of a conduction band between the crystalline silicon thin film 4 and the second semiconductor film 6. By desirably adjusting the energy level $B_{C1}$ at a lower end of a conduction band of the first semiconductor film 5, it is possible to suppress occurrence of kink phenomenon. As a result, the thin-film transistor device having reliable TFT characteristics can be provided.

In the thin-film transistor device 10 according to the present embodiment, the second semiconductor film 6 immediately below the insulating film 7 serving as a channel layer is an amorphous silicon film having a relatively great band gap. This structure can suppress a back channel caused by positive fixed charges included in the channel stopper layer. In particular, in the present embodiment, since the insulating film 7 serving as the channel stopper layer is made of organic material and includes more fixed charges, the second semiconductor film 6 is desirably an amorphous silicon film.

As described above, even if the channel stopper layer is composed of organic material like in the thin-film transistor device 10 according to the present embodiment, it is possible to suppress formation of a back channel to improve turn-Off characteristics and also suppress occurrence of kink phenomenon. As a result, a thin-film transistor having reliable characteristics can be provided.

Note that, in the present embodiment, the energy level at the lower end of the conduction band of the semiconductor film such as the first semiconductor film 5 can be adjusted by changing an electron affinity or a band gap. In the present embodiment, the energy level $E_{C1}$ at the lower end of the conduction band of the first semiconductor film 5 is adjusted to cause the energy levels of the respective semiconductor films to satisfy the relationship of $E_{CP} < E_{C1}$.

For example, by causing the first semiconductor film 5 and the second semiconductor film 6, each of which is mainly made of silicon, to have different band gaps, it is possible to adjust the energy levels of the lower ends of the conduction bands of the first semiconductor film 5 and the second semiconductor film 6. In this case, it is desirable that the band gap of the first semiconductor film 5 is closer to the band gap of the crystalline silicon thin film 4 than the band gap of the second semiconductor film 6 is. With this structure, at the junction between the crystalline silicon thin film 4 and the first semiconductor film 5, the energy levels at the lower ends of the conduction bands are continuous, thereby suppressing occurrence of a spike at the junction.

The energy level $E_{C1}$ at the lower end of the conduction band of the first semiconductor film 5 can be adjusted, as described earlier, also by changing a crystallization ratio of the semiconductor film such as the first semiconductor film 5 made mainly of silicon. In the present embodiment, the crystallization ratio of the first semiconductor film 5 composed of an amorphous silicon film is set to be greater than the crystallization ratio of the second semiconductor film 6 composed of an amorphous silicon film. With this structure, at the junction between the crystalline silicon thin film 4 and the first semiconductor film 5, the energy levels at the lower ends of the conduction bands are continuous, thereby suppressing occurrence of a spike at the junction.

Figure 8:
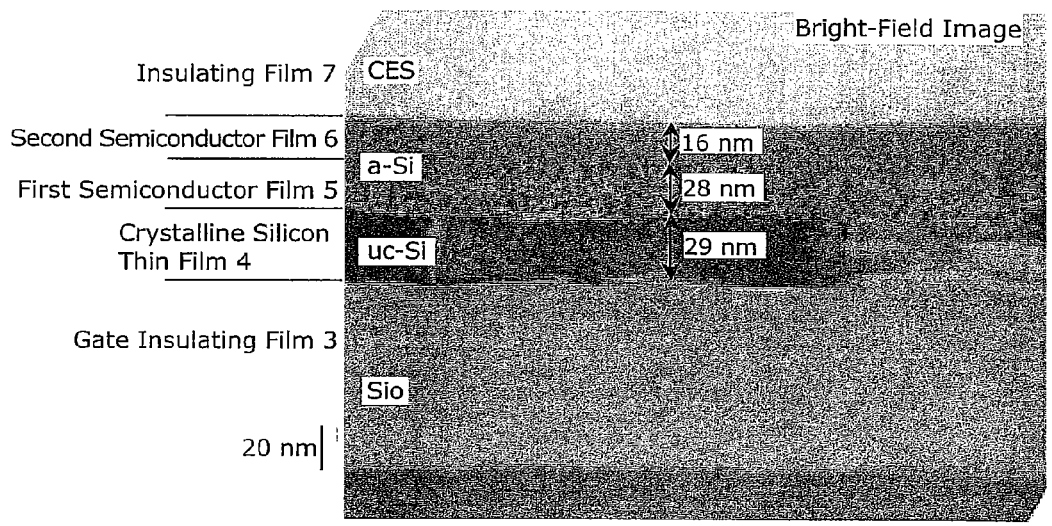
FIG. 8 is a Transmission Electron Microscope (TEM) image of cross-sectional surfaces of the thin-film transistor device according to the exemplary embodiment observed by a TEM.

Here, the structure of the semiconductor film in the thin-film transistor device 10 according to the present embodiment, which is actually manufactured, is described with reference to FIG. 8. FIG. 8 is a Transmission Electron Microscope (TEM) image of cross-sectional surfaces of the thin-film transistor device according to the present embodiment observed by a bright field. Conditions for forming the first semiconductor film 5 and the second semiconductor film 6 illustrated in FIG. 8 are as follows.

As illustrated in FIG. 8, the semiconductor films in the thin-film transistor device 10 according to the present embodiment are: the crystalline silicon thin film 4 having a microcrystalline structure with a thickness of 29 nm; the first semiconductor film 5 composed of an amorphous silicon film having a thickness of 28 nm; and the second semiconductor film 6 composed of an amorphous silicon film having a thickness of 16 nm.

Furthermore, in FIG. 8, a crystallization ratio is increased in an order of the second semiconductor film 6, the first semiconductor film 5, and the crystalline silicon thin film 4. In particular, the crystallization ratio of the first semiconductor film 5 is gradually increased as being closer to the crystalline silicon thin film 4.

Note that it has been described in the present embodiment that an example method of adjusting the energy level at the lower end of the conduction band of the semiconductor film such as the first semiconductor film 5 is a method of changing an electron affinity, a crystallization ratio, or a band gap. However, the present embodiment is not limited to the above. For example, it is possible to adjust the energy level at the lower end of the conduction band of the semiconductor film such as the first semiconductor film 5, by causing impurity such as carbon (C) to be included in the first semiconductor film 5 or the like which is made mainly of silicon. By causing impurity such as carbon to be included, a band offset part occurs in the conduction band. As a result, it is possible to change the energy level at the lower end of the conduction band of each semiconductor film such as the first semiconductor film 5.

In the present embodiment, since a spike occurs at a conduction band due to electrons accumulated in the drain electrode side, the energy level at the lower end of the conduction band is adjusted to suppress the spike. However, it is also considered that a spike occurs at a valence band due to holes accumulated in the source electrode side. In this case, a spike at a valence band can be suppressed by adjusting the energy levels at upper ends of the valence bands of the semiconductor films which are the crystalline silicon thin film 4, the first semiconductor film 5, and the second semiconductor film 6.

In this case, by changing an electron affinity, a crystallization ratio, or a band gap of each of the semiconductor films which are the crystalline silicon thin film 4, the first semiconductor film 5, and the second semiconductor film 6 as described earlier, it is possible to adjust the energy levels at the upper ends of the valence bands of the respective semiconductor films. It is also possible to adjust the energy levels at the upper ends of the valence bands of the respective semiconductor films such as the first semiconductor film 5, by causing impurity such as germanium (Ge) to be included in each of the semiconductor films, such as the first semiconductor film 5, which are made mainly of silicon. By causing impurity such as germanium to be included, a band offset part occurs in the corresponding valence band. As a result, it is possible to change the energy level at the lower end of the conduction band of each semiconductor film such as the first semiconductor film 5.

Next, the method for manufacturing the thin-film transistor device 10 according to the present embodiment shall be described with reference to FIGS. 9A to 9I. FIGS. 9A to 9I are cross-sectional views schematically illustrating respective steps in the method for manufacturing the thin-film transistor device according to the present embodiment.

Figure 9A:
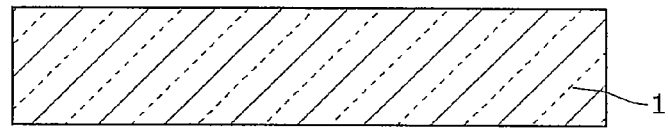
FIG. 9A is a cross-sectional view schematically illustrating a step of preparing a substrate in a method for manufacturing the thin-film transistor device according to the exemplary embodiment.

First, as illustrated in FIG. 9A, a glass substrate is prepared as the substrate 1. Prior to forming of the gate electrode 2, an undercoat layer composed of a silicon nitride film, a silicon oxide film, or a silicon oxynitride film may be formed on the substrate 1 by the plasma CVD or the like.

Figure 9B:
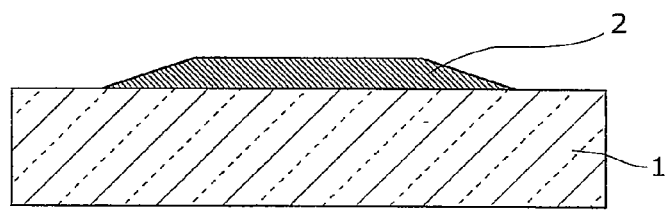
FIG. 9B is a cross-sectional view schematically illustrating a step of forming a gate electrode in the method for manufacturing the thin-film transistor device according to the exemplary embodiment.

Next, as illustrated in FIG. 9B, the gate electrode 2 in a predetermined shape is formed on/above the substrate 1. For example, the gate electrode 2 in the predetermined shape may be formed by forming a gate metal film made of molybdenum-tungsten (MoW) on the substrate 1 through sputtering, and by patterning the gate metal film using the photolithography and the wet etching. The wet etching on MoW may be performed using a chemical solution which is a mixture of trihydrogen phosphate ($H_3PO_4$), nitric acid ($HNO_3$), acetic acid ($CH_3COOH$) and water in a predetermined ratio, for example.

Figure 9C:
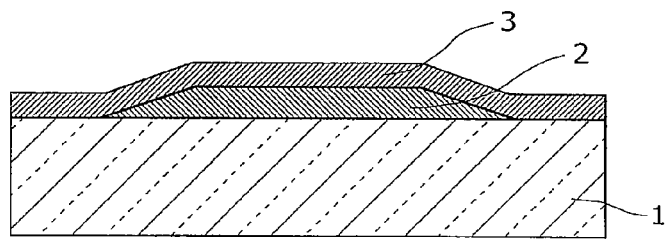
FIG. 9C is a cross-sectional view schematically illustrating a step of forming a gate insulating film in the method for manufacturing the thin-film transistor device according to the exemplary embodiment.

Next, as illustrated in FIG. 9C, the gate insulating film 3 is formed above the substrate 1 on which the gate electrode 2 is formed. For example, the gate insulating film 3 made of silicon oxide is formed by the plasma CVD or the like to cover the gate electrode 2. Silicon oxide is formed, for example, by introducing silane gas ($SiH_4$) and nitrous oxide gas ($N_2O$) in a predetermined ratio of concentration, for example.

Figure 9D:
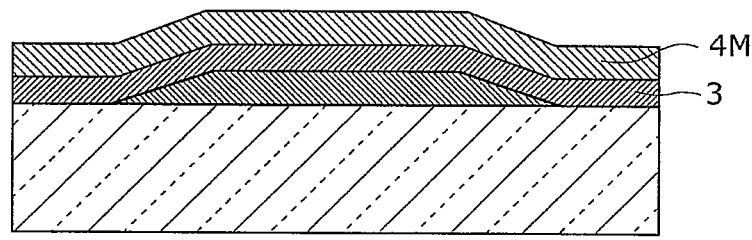
FIG. 9D is a cross-sectional view schematically illustrating a step of forming a crystalline silicon thin film in the method for manufacturing the thin-film transistor device according to the exemplary embodiment.

Next, as illustrated in FIG. 9D, the crystalline silicon thin film 4M having the channel region is formed on the gate insulating film 3. For example, first, an amorphous silicon thin film composed of amorphous silicon is formed by the plasma CVD or the like, and a dehydrogenation annealing is performed. After that, the amorphous silicon thin film is annealed for crystallization so as to form the crystalline silicon thin film 4M. The amorphous silicon film is formed by introducing silane gas ($SiH_4$) and hydrogen gas ($H_2$) in a predetermined ratio of concentration, for example.

Note that, in the present embodiment, the amorphous silicon thin film is crystallized by the laser annealing using the excimer laser. As the method for crystallization, the laser annealing using a pulse laser with a wavelength approximately 370 nm to 900 nm, the laser annealing using the continuous wave laser with a wavelength approximately 370 nm to 900 nm, or the annealing by the Rapid Thermal Processing (RTP) may be used. Furthermore, the crystalline silicon thin film 4M may be formed by a method such as direct growth by the CVD, instead of crystallizing the amorphous silicon thin film.

Subsequently, by performing hydrogen plasma treatment on the crystalline silicon thin film 4M, silicon atoms in the crystalline silicon thin film 4M are hydrotreated. The hydrogen plasma treatment is performed by generating hydrogen plasma from gas containing hydrogen gas such as $H_2$, $H_2$/argon (Ar), using a radio frequency (RF) power, and by irradiating the crystalline silicon thin film 4M with the hydrogen plasma. With the hydrogen plasma treatment, the dangling bond (defect) of silicon atoms are hydrogen terminated. As a result, the crystal defect density of the crystalline silicon thin film 4 is reduced, improving the crystallinity.

Figure 9E:
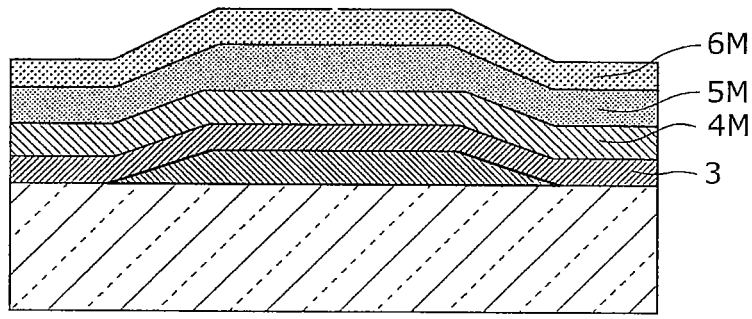
FIG. 9E is a cross-sectional view schematically illustrating a step of forming a first semiconductor film and a second semiconductor film in the method for manufacturing the thin-film transistor device according to the exemplary embodiment.

Next, as illustrated in FIG. 9E, a multi-layer film consisting of a plurality of semiconductor films which are the first semiconductor film 5M and the second semiconductor film 6M on the channel region of the crystalline silicon thin film 4M. In this step, the first semiconductor film 5M and the second semiconductor film 6M are formed to satisfy $E_{CP} < E_{C1}$ relationship between the energy level at the lower end of the conduction band of the crystalline silicon thin film 4M and the energy level at the lower end of the conduction band of the first semiconductor film 5M.

In the present embodiment, the first semiconductor film 5M and the second semiconductor film 6M are continuously formed in the same vacuum apparatus. More specifically, the first semiconductor film 5M and the second semiconductor film 6M are formed without breaking vacuum. For example, if an amorphous silicon film is formed on the crystalline silicon thin film 4M under the predetermined film-forming conditions by using plasma CVD or the like after forming the crystalline silicon thin film 4M, it is possible to continuously form the first semiconductor film 5M and the second semiconductor film 6M. Regarding the film-forming conditions, for example, it is possible to set an RF power concentration to be greater or set a film-forming rate to be slower in comparison to the film-forming conditions for the amorphous silicon film in forming the crystalline silicon thin film 4M.

More specifically, the multi-layer film including the first semiconductor film 5M and the second semiconductor film 6M can be formed, by introducing silane gas ($SiH_4$) and hydrogen gas ($H_2$) in a predetermined ratio of concentration by using the parallel plate type RF plasma CVD apparatus, when a flow rate of silane gas is 5 sccm to 15 sccm, a flow rate of hydrogen gas is 40 sccm to 75 sccm, a pressure is 1 Torr to 3 Torr, RF power is 0.1 kw/cm$^{-2}$ to 0.4 kw/cm$^{-2}$, and a distance between electrode substrates is 200 mm to 600 mm. In the present embodiment, the film forming is performed at a flow rate of silane gas of 10 sccm, a flow rate of hydrogen gas of 60 sccm, a pressure of 0.5 Torr, RF power of 0.25 kw/cm$^{-2}$, and a distance between electrode substrates of 300 mm.

Under the above-described film-forming conditions, amorphous silicon films are formed from the surface of the crystalline silicon thin film 4. A amorphous silicon film formed on and close to the surface of the crystalline silicon thin film 4M takes over the crystallinity of the crystalline silicon thin film 4M and is thereby naturally crystallized. In progressing the film forming, as being father away from the crystalline silicon thin film 4M, the crystallization ratio in the film is decreased. A film formed after reaching the crystallization ratio of zero is the second semiconductor film 6M that is an amorphous silicon film having amorphous components only with the crystallization ratio of zero. In other words, crystallization is progressed for the amorphous silicon film formed on and close to the surface of the crystalline silicon thin film 4M serving as an under-layer. Therefore, the first semiconductor film 5M and the second semiconductor film 6M are formed so that the crystallization ratio of the lower layer (first semiconductor film 5M) is naturally greater than the crystallization ratio of the upper layer (second semiconductor film 6M).

It is also possible to form the first semiconductor film 5M and the second semiconductor film 6M having different crystallization ratios by switching the film-forming conditions to another on purpose during forming the amorphous silicon film. For example, by changing concentration ratios or flow rates of material gas such as silane gas ($SiH_4$) and hydrogen gas ($H_2$) or changing a pressure in the vacuum apparatus, it is possible to form the first semiconductor film 5M and the second semiconductor film 6M having different crystallization ratios.

As a result, the first semiconductor film 5M and the second semiconductor film 6M can be formed at the same time to satisfy the relationship of $E_{CP}<E_{C1}$. Note that in the present embodiment, since the first semiconductor film 5M and the second semiconductor film 6M are continuously formed, it is possible to consider that they are a single film consisting of two layers (the first and second semiconductor layers) having different crystallization ratios.

The above-described processing can form a semiconductor film including the first semiconductor film 5M and the second semiconductor film 6M having different electron affinity. In the present embodiment, it is possible to form the first semiconductor film 5M and the second semiconductor film 6M so that the electron affinity of the first semiconductor film 5M is greater than the electron affinity of the second semiconductor film 6M.

Furthermore, the above-described processing can form a semiconductor film including the first semiconductor film 5M and the second semiconductor film 6M having different band gaps. In the present embodiment, it is possible to form the first semiconductor film 5M and the second semiconductor film 6M so that the band gap of the first semiconductor film 5M is closer to the band gap of the crystalline silicon thin film 4M than the band gap of the second semiconductor film 6M is.

Figure 9F:
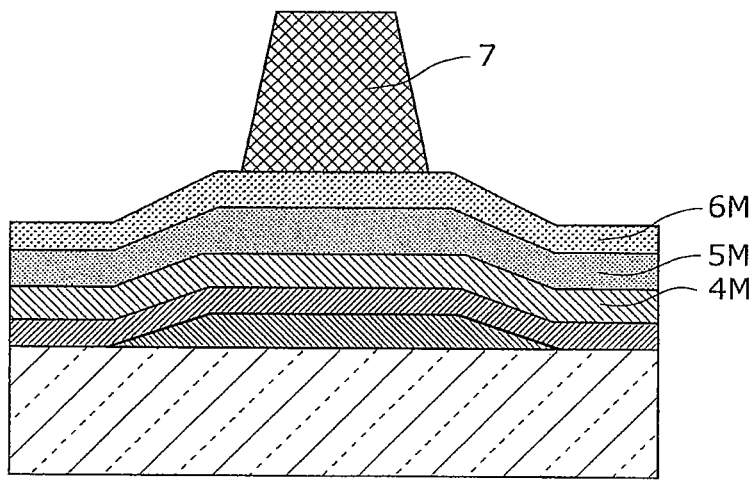
FIG. 9F is a cross-sectional view schematically illustrating a step of forming an insulating film in the method for manufacturing the thin-film transistor device according to the exemplary embodiment.

Next, as illustrated in FIG. 9F, the insulating film 7 having a predetermined shape is formed on the second semiconductor film 6M. In this case, first, a predetermined organic material of the insulating film 7 is coated on the second semiconductor film 6M by a predetermined coating method. Then, spin coating or slit coating is performed to form an insulating film forming film on the entire top surface of the second semiconductor film 6M. The thickness of the organic material can be controlled by a viscosity of the organic material or coating conditions (rotation frequency, blade speed, or the like). Note that the material of the insulating film forming film may be a photosensitive-coated organic material including silicon, oxygen, and carbon. After that, prebaking is performed on the insulting film forming film at a temperature of approximately 110 C.° for approximately 60 seconds to preliminary burn the insulting film forming film. As a result, solvent included in the insulating film forming film evaporates. After that, the insulting film forming film is patterned by lithographic exposure and development using a photo mask, thereby forming the insulating film 7 in the predetermined shape. After that, post-baking at a temperature of 280 C.° to 300 C.° for approximately one hour is performed on the patterned insulating film 7 to principally burn the insulating film 7 to be solidified. Therefore, a part of the organic components in the insulating film 7 evaporates and is dissolved to have improved film quality.

Figure 9G:
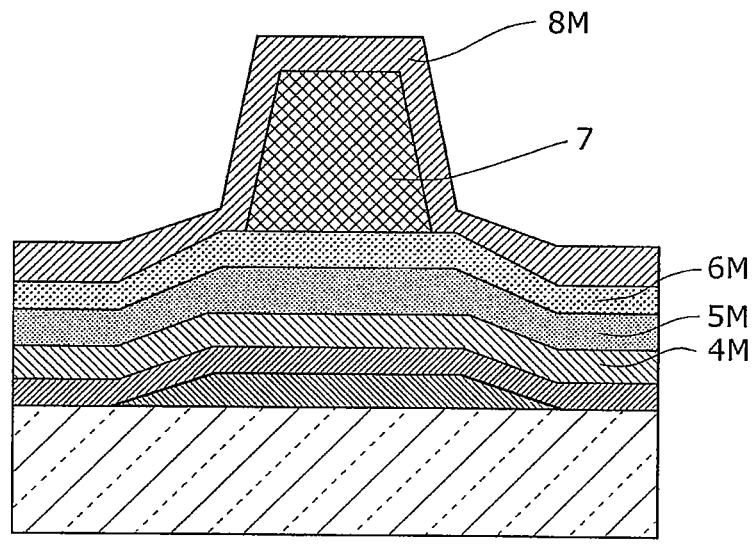
FIG. 9G is a cross-sectional view schematically illustrating a step of forming a contact-layer forming film in the method for manufacturing the thin-film transistor device according to the exemplary embodiment.

Next, as illustrated in FIG. 9G, the contact layer forming film 8M to be the contact layer 8 is formed on the second semiconductor film 6M to cover the insulating film 7. For example, by plasma CVD, the contact layer forming film 8M made of an amorphous silicon doped with impurity of quinquevalent element such as phosphorus is formed.

Note that, the contact layer forming film 8M may consist of two layers: a lower low-concentration electric field limiting layer and an upper high-concentration contact layer. The low-concentration electric field limiting layer can be formed by doing phosphorus of approximately $1 \times 10^{17}$ ($atm/cm^3$) to the contact layer forming film 8M. The above-described two layers may be continuously formed by a CVD apparatus, for example.

Figure 9H:
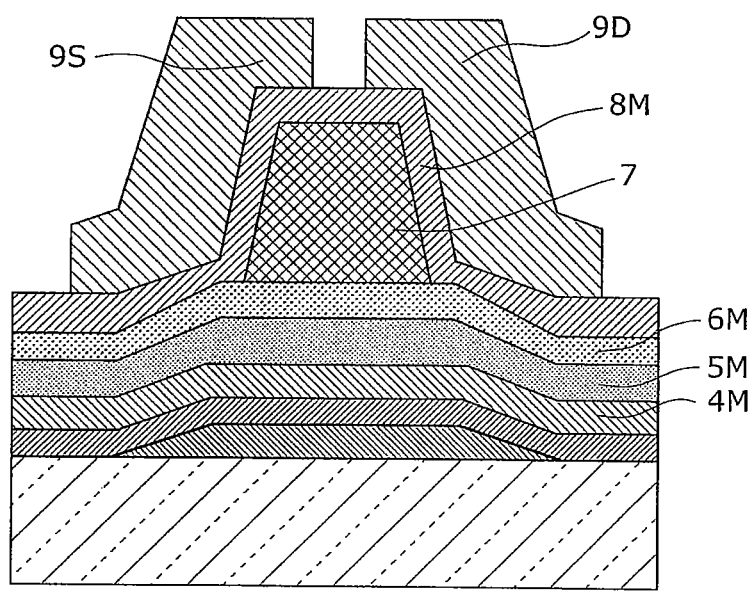
FIG. 9H is a cross-sectional view schematically illustrating a step of forming a source electrode and a drain electrode in the method for manufacturing the thin-film transistor device according to the exemplary embodiment.

Next, as illustrated in FIG. 9H, the source electrode 9S and the drain electrode 9D are patterned on the contact layer forming film 8M. In this case, first, a source drain metal film made of a material to be the source electrode 9S and the drain electrode 9D is formed by sputtering, for example. After that, a resist patterned in a predetermined shape is formed on the source drain metal film, and wet etching is performed for the resist to pattern the source drain metal film. Here, the contact layer forming film 8M functions as an etching stopper. Then, by removing the resist, it is possible to form the source electrode 9S and the drain electrode 9D having the shape as illustrated in FIG. 9H.

Figure 9I:
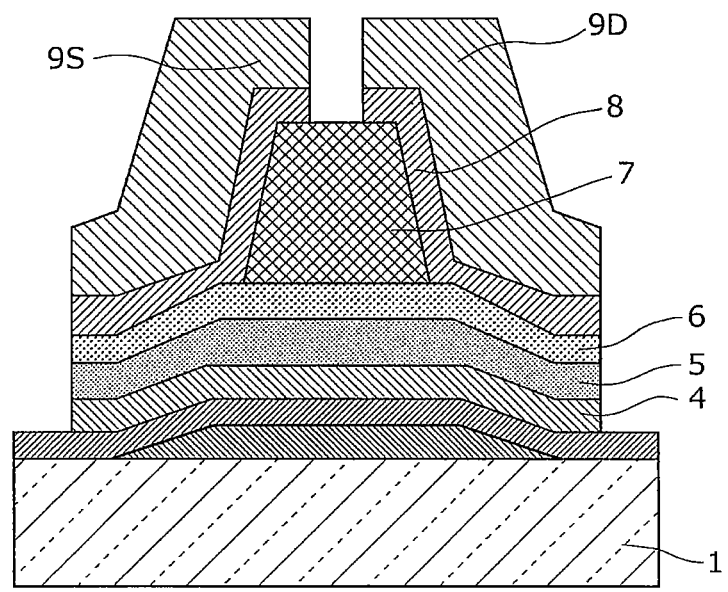
FIG. 9I is a cross-sectional view schematically illustrating a step of patterning on the contact layer and the semiconductor layer in the method for manufacturing the thin-film transistor device according to the exemplary embodiment.

Next, using the source electrode 9S and the drain electrode 9D as masks, dry etching is performed to pattern the contact layer forming film 8M, the second semiconductor film 6M, the first semiconductor film 5M, and the crystalline silicon thin film 4M to have an island shape. At this step, the first semiconductor film 5 and the second semiconductor film 6 which have been continuously formed are patterned at the same time. Therefore, as illustrated in FIG. 9I, it is possible to form a semiconductor layer having a shape of an island formed by a plurality of semiconductor films including a pair of contact layers 8, the second semiconductor film 6, the first semiconductor film 5, and the crystalline silicon thin film 4 in the predetermined shape. Here, dry etching desirably uses chlorine gas.

As described above, the thin-film transistor device 10 according to the present embodiment is manufactured.

Note that in the manufacturing method according to the present embodiment, the first semiconductor film 5M and the second semiconductor film 6M are continuously formed in the same vacuum apparatus, but it is also possible to form the first semiconductor film 5M and the second semiconductor film 6M separately in different steps under different film-forming conditions. It is therefore possible to suppress variations of elements in the first semiconductor film 5 and the second semiconductor film 6, thereby providing a thin-film transistor device suitable for a large panel.

Note also that, in the manufacturing method according to the present embodiment, the crystalline silicon thin film 4, the first semiconductor film 5, and the second semiconductor film 6 are patterned by being etched at the same time at the same step. However, it is also possible to perform the patterning of the crystalline silicon thin film 4 and the patterning of the first semiconductor film 5 and the second semiconductor film 6 at different steps. In this case, the first semiconductor film 5 and the second semiconductor film 6 may have the same shape as or different shapes from that of the crystalline silicon thin film 4. Any structure is possible for the first semiconductor film 5 and the second semiconductor film 6 as long as they are formed over the channel region.

In the manufacturing method according to the present embodiment, in the step for forming the first semiconductor film 5M and the second semiconductor film 6M, the film-forming conditions are adjusted to change electron affinity, crystallization ratios, or band gaps of the first semiconductor film 5 and the second semiconductor film 6 so as to adjust energy levels at the lower ends of the conduction bands. However, the present embodiment is not limited to the above. For example, in the step for forming the first semiconductor film 5 and the second semiconductor film 6, impurity such as carbon is doped into the first semiconductor film 5 made mainly of silicon so as to adjust the energy level at the lower end of the conduction band. It is also possible that, in order to adjust the energy level at the upper end of the valence band, in the step for forming the first semiconductor film 5 and the second semiconductor film 6, impurity such as germanium is doped into the first semiconductor film 5 made mainly of silicon. Here, in order to dope impurity such as carbon or germanium into the first semiconductor film 5, it is desirable to form the first semiconductor film 5 and the second semiconductor film 6 separately in different steps.

Next, an example of applying the thin-film transistor device 10 according to the present embodiment to a display device is described with reference to FIG. 10. In the present embodiment, the thin-film transistor device 10 is applied to an organic EL display device.

Figure 10:
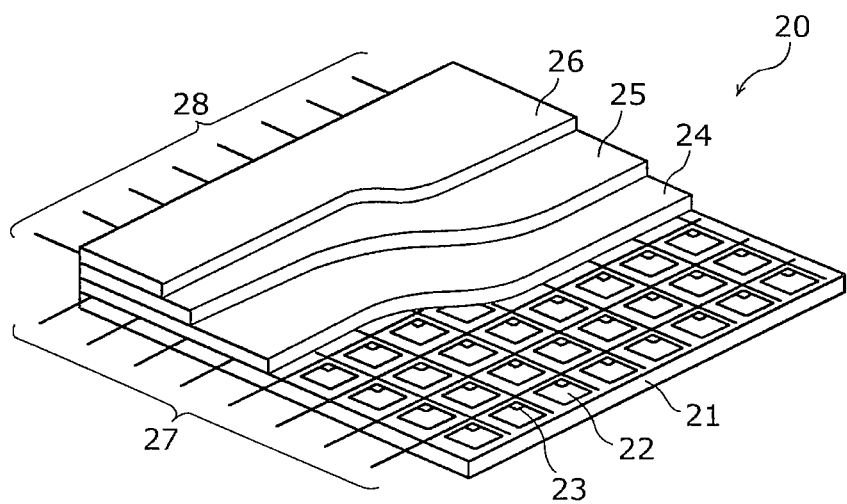
FIG. 10 is a partly-cutaway cross-sectional view of an organic EL display device according to the exemplary embodiment.

FIG. 10 is a partly-cutaway cross-sectional view of the organic EL display device according to the present embodiment. The above-described thin-film transistor device 10 can be used as switching transistors or driving transistors on an active matrix substrate for an organic EL display device.

As illustrated in FIG. 10, the organic EL display device 20 includes: an active matrix substrate (TFT array substrate) 21; pixels 22 arranged in a matrix on the active matrix substrate 21; pixel circuits 23 arranged in an array on the active matrix substrate 21 to be connected to the respective pixels; an anode 24, an organic EL layer 25, and a cathode 26 (transparent electrode) which are sequentially stacked on the pixels 22 and the pixel circuits 23; and source lines 27 and gate lines 28 connecting the pixel circuits 23 to a control circuit (not illustrated). The organic EL layer 25 has a multi-layer structure including an electron transport layer, a luminescence layer, a hole transport layer, and the like.

Figure 11:
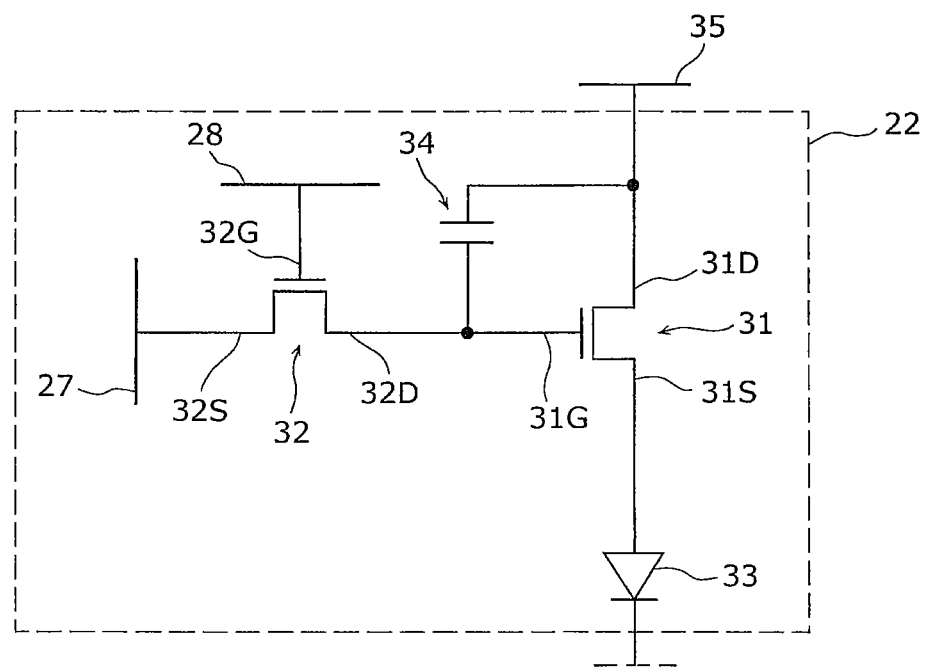
FIG. 11 is a diagram illustrating a circuit structure of a pixel having the thin-film transistor device according to the exemplary embodiment.

Next, a circuit structure of each of the pixels 22 in the above-described organic EL display device 20 is described with reference to FIG. 11. FIG. 11 is a diagram illustrating the circuit structure of the pixel including the thin-film transistor device according to the present embodiment.

As illustrated in FIG. 11, the pixel 22 includes a driving transistor 31, a switching transistor 32, an organic EL element 33, and a capacitor 34. The driving transistor 31 drives the organic EL element 33. The switching transistor 32 selects the pixel 22.

A source electrode 32S of the switching transistor 32 is connected to the source line 27. The gate electrode 32G of the switching transistor 32 is connected to the gate line 28. The drain electrode 32D of the switching transistor 32 is connected to the capacitor 34 and the gate electrode 31G of the driving transistor 31.

The drain electrode 31D of the driving transistor 31 is connected to the power line 35. The source electrode 31S of the driving transistor 31 is connected to the anode of the organic EL element 33.

With this structure, when the gate signal is inputted to the gate line 28 to turn On the switching transistor 32, a signal voltage supplied via the source line 27 is written into the capacitor 34. Then, the hold voltage written to the capacitor 34 is held for one-frame duration. This hold voltage causes analog changes in conductance of the driving transistor 31. Therefore, driving current corresponding to luminescence graduation flows from the anode of the organic EL element 33 to the cathode. As a result, the organic EL element 33 emits light to display a predetermined image.

Note that, in the present embodiment, the organic EL display device including organic EL elements have been described, but the present embodiment can be applied also to other display devices using active matrix substrates. The display device having a such structure can be used as a flat panel display, and can be applied to electronic devices, such as a television set, a personal computer, and a mobile phone, which have various display panels.

Although the thin-film transistor device and the method for manufacturing the thin-film transistor device according to the present disclosure has been described based on the present embodiment, they are not limited to the above-described present embodiment.

For example, although it has been described in the present embodiment that the crystalline grain size of the crystalline silicon grains in the first semiconductor film 5 is gradually increased as being closer to the crystalline silicon thin film 4, it is also possible that a density degree of the crystalline grain size (crystalline silicon grain) included in the first semiconductor film 5 is gradually increased as being closer to the crystalline silicon thin film 4. In the above case, the crystallization ratio in a thickness direction of the first semiconductor film 5 is also gradually increased as being closer to the crystalline silicon thin film 4.

Those skilled in the art will be readily appreciated that various modifications and combinations of the structural elements and functions in the present embodiment are possible without materially departing from the novel teachings and advantages of the present disclosure. Accordingly, all such modifications and combinations are intended to be included within the scope of the present disclosure.

Each of the structural elements in each of the above-described embodiments may be configured in the form of an exclusive hardware product, or may be realized by executing a software program suitable for the structural element. Each of the structural elements may be realized by means of a program executing unit, such as a CPU and a processor, reading and executing the software program recorded on a recording medium such as a hard disk or a semiconductor memory. Here, the software program for realizing organic thin-film transistor according to each of the embodiments is a program described below.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The organic thin-film transistor according to the exemplary embodiment disclosed herein is widely applicable in display devices such as a television set, a personal computer, and a mobile phone, and the other various electric devices.

The invention claimed is:
1. A thin-film transistor device comprising:
a gate electrode above a substrate;
a gate insulating film above the gate electrode;
a crystalline silicon thin film above the gate insulating film, the crystalline silicon thin film including a channel region;
a plurality of semiconductor films above at least the channel region;
an insulating film over the channel region and above the semiconductor films, the insulating film being composed of an organic material;
a source electrode over at least an end portion of the insulating film; and
a drain electrode over at least an other end portion of the insulating film, the drain electrode facing the source electrode, wherein the semiconductor films include at least a first semiconductor film and a second semiconductor film provided above the first semiconductor film, $E_{CP} < E_{C1}$ where $E_{CP}$ denotes an energy level at a lower end of a conduction band of the crystalline silicon thin film and $E_{C1}$ denotes an energy level at a lower end of a conduction band of the first semiconductor film, the first semiconductor film is provided on the crystalline silicon thin film, and the energy level $E_{CP}$ at the lower end of the conduction band of the crystalline silicon thin film and the energy level $E_{C1}$ at the lower end of the conduction band of the first semiconductor film are adjusted to suppress a spike at a junction between the crystalline silicon thin film and the first semiconductor film.

2. The thin-film transistor device according to claim 1, wherein electron affinity of the first semiconductor film is different from electron affinity of the second semiconductor film.

3. The thin-film transistor device according to claim 2, wherein the electron affinity of the first semiconductor film is greater than the electron affinity of the second semiconductor film.

4. The thin-film transistor device according to claim 1, wherein the first semiconductor film and the second semiconductor film are semiconductor films made mainly of silicon and have different band gaps.

5. The thin-film transistor device according to claim 4, wherein the band gap of the first semiconductor film is closer to a band gap of the crystalline silicon thin film than the band gap of the second semiconductor film is.

6. The thin-film transistor device according to claim 1, wherein the first semiconductor film and the second semiconductor film are amorphous silicon films.

7. The thin-film transistor device according to claim 1, wherein the first semiconductor film and the second semiconductor film are semiconductor films made mainly of silicon and have different crystallization ratios.

8. The thin-film transistor device according to claim 7, wherein the crystallization ratio of the first semiconductor film is greater than the crystallization ratio of the second semiconductor film.

9. The thin-film transistor device according to claim 1, wherein, from the first semiconductor film to the crystalline silicon thin film, no barrier exists between the conduction band of the first semiconductor film and the conduction band of the crystalline silicon thin film.

10. The thin-film transistor device according to claim 9, wherein the first semiconductor film includes one of carbon and germanium.

* * * * *